(12) United States Patent
Sato et al.

(10) Patent No.: US 8,677,933 B2
(45) Date of Patent: Mar. 25, 2014

(54) FILM FORMING APPARATUS FORMING A COATING FILM USING SPIRAL COATING WHILE ADJUSTING SOUND WAVE PROJECTED ONTO THE COATING FILM

(75) Inventors: Tsuyoshi Sato, Yokohama (JP); Kenichi Ooshiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 199 days.

(21) Appl. No.: 13/214,409

(22) Filed: Aug. 22, 2011

(65) Prior Publication Data

US 2012/0064349 A1 Mar. 15, 2012

(30) Foreign Application Priority Data

Sep. 15, 2010 (JP) ................................. 2010-206715

(51) Int. Cl.
| | | |
|---|---|---|
| B05C 11/00 | (2006.01) | |
| B05C 13/02 | (2006.01) | |
| B05C 11/02 | (2006.01) | |
| B05B 3/00 | (2006.01) | |
| B06B 1/02 | (2006.01) | |
| B01J 19/08 | (2006.01) | |
| B05D 1/40 | (2006.01) | |
| B05D 3/00 | (2006.01) | |

(52) U.S. Cl.
USPC ............. 118/663; 118/708; 118/712; 118/56; 118/58; 118/323; 427/560; 427/331; 264/442

(58) Field of Classification Search
USPC ...................... 427/600, 560; 118/56, 320, 612
See application file for complete search history.

(56) References Cited

U.S. PATENT DOCUMENTS

| | | | | |
|---|---|---|---|---|
| 3,198,170 A | * | 8/1965 | Onishi | 118/627 |
| 4,290,384 A | * | 9/1981 | Ausschnitt et al. | 118/722 |
| 4,806,455 A | * | 2/1989 | LaBianca | 430/325 |
| 4,996,080 A | * | 2/1991 | Daraktchiev | 427/600 |
| 5,336,534 A | * | 8/1994 | Nakajima et al. | 427/600 |
| 5,403,617 A | * | 4/1995 | Haaland | 427/421.1 |
| 5,687,905 A | * | 11/1997 | Tsai | 239/4 |
| 6,004,622 A | * | 12/1999 | Yen et al. | 427/240 |
| 6,190,727 B1 | * | 2/2001 | Thaggard | 427/9 |

(Continued)

FOREIGN PATENT DOCUMENTS

| | | |
|---|---|---|
| JP | 61-128523 | 6/1986 |
| JP | 63-123465 | 5/1988 |

(Continued)

OTHER PUBLICATIONS

Office Action issued Jul. 31, 2012 in Japanese Patent Application No. 2010-206715 with English language translation.

*Primary Examiner* — Dah-Wei Yuan
*Assistant Examiner* — Karl Kurple
(74) *Attorney, Agent, or Firm* — Oblon, Spivak, McClelland, Maier & Neustadt, L.L.P.

(57) ABSTRACT

According to one embodiment, a film forming apparatus includes: a stage on which a coating object is placed; a rotation mechanism rotating the stage; an application nozzle supplying a coating material to the coating object; an application moving mechanism moving the application nozzle; a controller which controls the rotation mechanism and application moving mechanism to rotate the stage and move the application nozzle between the rotation center and the outer edge and controls the application nozzle to apply the coating material to the coating object; and a sound wave generator which generates a sound wave. The film forming apparatus projects the sound wave onto the surface of the coating film.

11 Claims, 17 Drawing Sheets

(56) References Cited

U.S. PATENT DOCUMENTS

| | | | |
|---|---|---|---|
| 6,407,009 B1* | 6/2002 | You et al. | 438/782 |
| 6,503,580 B1* | 1/2003 | Ruffa | 427/600 |
| 6,530,340 B2* | 3/2003 | You et al. | 118/696 |
| 6,746,539 B2* | 6/2004 | Sun et al. | 118/715 |
| 6,758,908 B2* | 7/2004 | Whitman | 118/697 |
| 6,880,560 B2* | 4/2005 | Ching et al. | 134/1.3 |
| 6,881,437 B2* | 4/2005 | Ivanov et al. | 438/676 |
| 7,033,068 B2* | 4/2006 | Ching et al. | 366/108 |
| 7,553,375 B2* | 6/2009 | Sekiya | 118/62 |
| 7,754,125 B2* | 7/2010 | Katai | 264/216 |
| 8,282,999 B2* | 10/2012 | Sinha et al. | 427/560 |
| 8,506,709 B2* | 8/2013 | Ryabova | 118/612 |
| 8,573,150 B2* | 11/2013 | Vecerina et al. | 118/681 |
| 2004/0009611 A1* | 1/2004 | Williams et al. | 436/180 |
| 2005/0092397 A1* | 5/2005 | Statnikov | 148/400 |
| 2005/0147743 A1* | 7/2005 | Sekiya | 427/140 |
| 2006/0266387 A1* | 11/2006 | Verhaverbeke et al. | 134/78 |
| 2006/0266393 A1* | 11/2006 | Verhaverbeke et al. | 134/198 |
| 2007/0069428 A1* | 3/2007 | Pfaff et al. | 264/442 |
| 2007/0076025 A1* | 4/2007 | Nagashima | 347/7 |
| 2007/0281071 A1* | 12/2007 | Eidenschink et al. | 427/2.1 |
| 2008/0103054 A1* | 5/2008 | Williams et al. | 506/7 |
| 2008/0103062 A1* | 5/2008 | Williams et al. | 506/18 |
| 2009/0020144 A1* | 1/2009 | Verhaverbeke et al. | 134/95.1 |
| 2009/0151161 A1* | 6/2009 | Sekiya | 29/846 |
| 2009/0160887 A1* | 6/2009 | Hamazaki et al. | 347/7 |
| 2009/0224066 A1* | 9/2009 | Riemer | 239/102.2 |
| 2010/0310757 A1* | 12/2010 | Ooshiro et al. | 427/8 |
| 2011/0036171 A1* | 2/2011 | Maris et al. | 73/606 |
| 2011/0041871 A1* | 2/2011 | Fan | 134/1 |
| 2011/0204490 A1* | 8/2011 | Sato et al. | 257/632 |
| 2011/0239939 A1* | 10/2011 | Van Sciver et al. | 118/708 |
| 2012/0135660 A1* | 5/2012 | Sekiya | 445/23 |

FOREIGN PATENT DOCUMENTS

| | | |
|---|---|---|
| JP | 04-340217 | 11/1992 |
| JP | 06-151296 | 5/1994 |
| JP | 11-135427 | 5/1999 |
| JP | 2001-310155 | 11/2001 |
| JP | 2003-109893 | 4/2003 |
| JP | 2010-087198 | 4/2010 |
| WO | WO 2010/053125 A1 | 5/2010 |

* cited by examiner

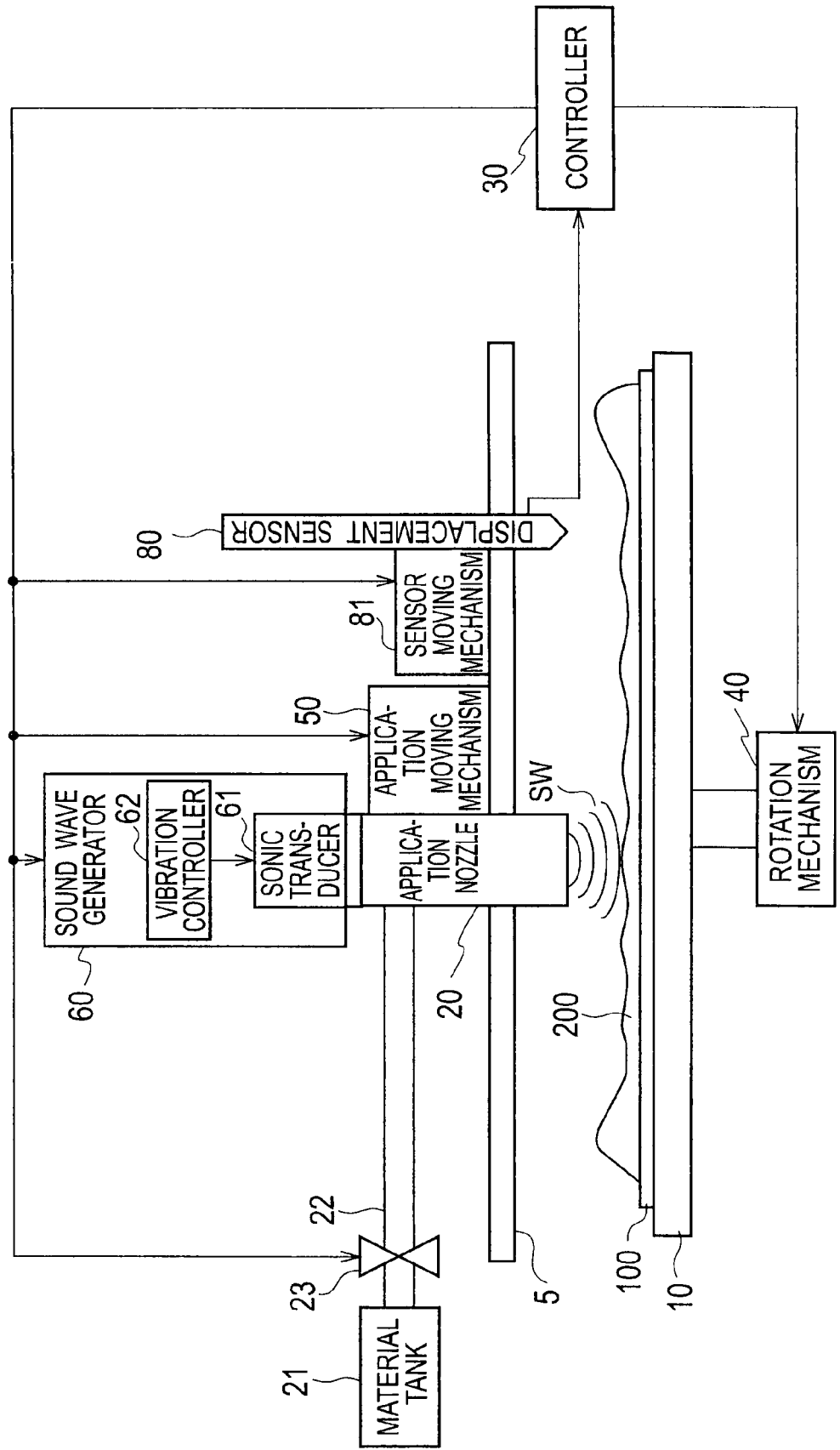

FILM FORMING APPARATUS FORMING A COATING FILM USING SPIRAL COATING WHILE ADJUSTING SOUND WAVE PROJECTED ONTO THE COATING FILM

CROSS REFERENCE TO RELATED APPLICATIONS AND INCORPORATION BY REFERENCE

This application is based upon and claims the benefit of priority from prior Japanese Patent Application P2010-206715 filed on Sep. 15, 2010; the entire contents of which are incorporated by reference herein.

FIELD

Embodiments described herein relate generally to the film forming apparatus, the film forming method, and the electronic device.

BACKGROUND

In the field of manufacturing of semiconductor devices, spin coating is used at forming coating films such as photoresist films or protective films to apply coating materials to coating objects. At the spin coating, coating material is applied to the center of a coating object fixed on a stage, and then the stage is rotated at high speed. The coating material on the coating object is spread over the entire surface of the coating object by centrifugal force, thus forming a coating film.

However, the coating material scatters at the spin coating, and the use efficiency of the material is as low as about 30%. Accordingly, there is a proposition of a spiral coating method which applies the coating material to the coating object in a spiral fashion to increase the use efficiency of the coating material.

However, the spiral coating has a problem of uneven thickness of the coating film formed on the coating object. Specifically, at the spiral coating, the application nozzle is moved in such application intervals that adjacent parts of the coating material overlap on the coating object. This causes unevenness in thickness of the coating film (hereinafter, referred to as coating pitch unevenness) in such a manner that the thickness of the coating film periodically changes at the coating pitch. Even if the coating material is arranged at regular intervals on the coating object, the coating pitch unevenness is similarly caused. Moreover, the circumferential speed is zero at the center of the coating object from which the coating starts. The coating film is therefore thick at the center thereof (hereinafter, starting point unevenness). Furthermore, the coating material dries quickly in the periphery of the coating film. Accordingly, there is a tendency of the coating film to include protrusions (a crown).

BRIEF DESCRIPTION OF THE DRAWINGS

FIG. 14 is a schematic view showing a configuration of a film forming apparatus according to a first modification of the third embodiment.

DETAILED DESCRIPTION

In general, according to one embodiment, a film forming apparatus includes: a stage on which a coating object is placed; a rotation mechanism rotating the stage about a rotation axis extending in the normal direction of the surface of the coating object; an application nozzle supplying a coating material to the surface of the coating object; an application moving mechanism moving the position of the application nozzle on the stage along the surface of the coating object; a controller which controls the rotation mechanism and application moving mechanism to rotate the stage and move the position of the application nozzle between the rotation center of the stage and the outer edge thereof and controls the application nozzle to apply the coating material to the surface of the coating object; and a sound wave generator which generates a sound wave which is to be projected onto the surface of the coating film formed by applying the coating material to the coating object. The film forming apparatus projects the sound wave onto the surface of the coating film.

Hereinafter, a description is given of first to third embodiments with reference to the drawings.

First Embodiment

Figure 1:
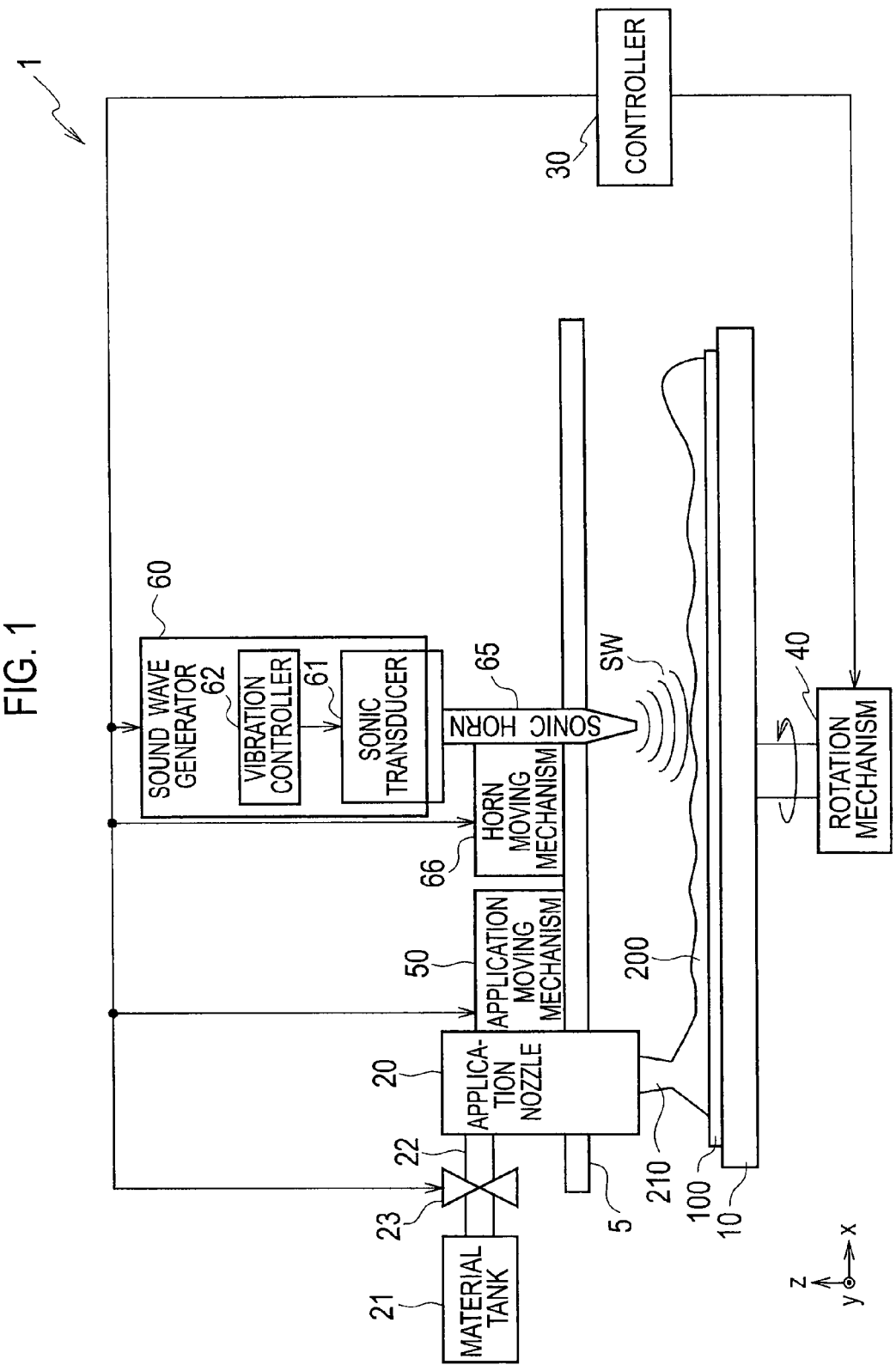
FIG. 1 is a schematic view showing a configuration of a film forming apparatus according to a first embodiment.

As shown in FIG. 1, a film forming apparatus 1 according to the first embodiment includes a stage 10 on which a coating object is placed, a rotation mechanism 40, an application nozzle 20, an application moving mechanism 50, a controller 30, and a sound wave generator 60. The rotation mechanism 40 rotates the stage 10. The application nozzle 20 supplies a coating material 210 to the surface of the coating object 100. The application moving mechanism 50 moves the position of the application nozzle 20. The controller 30 controls the rotation mechanism 40, application nozzle 20, and application moving mechanism 50. The sound wave generator 60 generates a sound wave SW which is to be projected onto the surface of a coating film 200 formed by applying the coating material 210 to the coating object 100. The film forming apparatus 1 projects the sound wave SW onto the surface of the coating film 200.

The rotation mechanism 40 rotates the stage 10 about the rotation axis extending in the normal direction of the surface of the coating object 100. The application moving mechanism 50 moves the position of the application nozzle 20 on the stage 10 along the surface of the coating object 100. The controller 30 controls the rotation mechanism 40 and application moving mechanism 50 to rotate the stage 10 and move the position of the application nozzle 20 between the rotation center of the stage 10 and the outer edge and controls the application nozzle 20 to apply the coating material 210 to the surface of the coating object 100.

In the followings, the normal direction of the surface of the coating object 100 on which the coating film 200 is formed is a direction z; the right and left direction in relation to FIG. 1, a direction x; and a vertical direction to the paper surface of FIG. 1, a direction y.

The coating object 100 is a substrate such as a wafer, for example. On the coating object 100, the coating film 200 such as a photoresist film or a protective film is formed by the film forming apparatus 1. The stage 10 includes a fixing mechanism configured to fix the coating object 100 to the stage 10, and the coating object 100 is fixed on the stage 10 by the fixing mechanism. The fixing mechanism can be an air sucking mechanism, for example.

The application nozzle 20 receives the coating material 210 fed through a material supply line 22 such as a tube or a pipe from a material tank 21 storing the coating material 210. The material supply line 22 is provided with a coating amount adjustment unit 23 which regulates the amount of the coating material 210 fed from the material tank 21 to the application nozzle 20. The amount of the coating material 210 supplied from the application nozzle 20 onto the surface of the coating object 100 is thus adjusted by the coating amount adjustment unit 23. The coating amount adjustment unit 23 is controlled by the controller 30.

Figure 2:
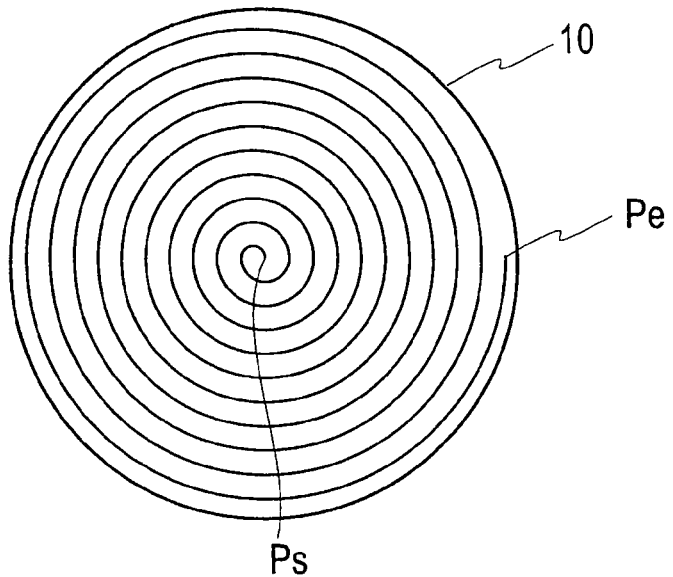
FIG. 2 is a schematic view showing an example of a trajectory of an application nozzle of the film forming apparatus according to the first embodiment.

While the application nozzle 20 supplies the coating material 210 to the surface of the coating object 100, the rotation mechanism 40 and application moving mechanism 50 are controlled to move the application nozzle 20 linearly from the rotation center of the rotating stage 10 toward the outer edge. As shown in FIG. 2, for example, the trajectory of the application nozzle 20 projected onto the circular stage 10 is spiral.

FIG. 1 shows an example in which the application moving mechanism 50 attached to the support 5 placed above the stage 10 moves the application nozzle 20 in the directions x and y over the stage 10 whose position is fixed. However, it is possible to move the stage 10 under the application nozzle 20 whose position is fixed. The application moving mechanism 50 can be a linear motor moving mechanism using a linear motor as a driving source, a feed screw moving mechanism using a motor as a driving source, or the like, for example. The application nozzle 20 can be moved also in the direction z by the application moving mechanism 50. The distance between the application nozzle 20 and the surface of the coating object 100 can be therefore adjusted by the controller 30.

The sound wave generator 60 includes a sonic transducer 61 and a vibration controller 62. The sonic transducer 61 is a device which converts electric energy to sonic mechanical vibration. The vibration controller 62 supplies a predetermined driving voltage to the sonic transducer 61 so as to operate the sonic transducer 61 at a predetermined frequency.

In the film forming apparatus 1 shown in FIG. 1, the sonic vibration generated by the sonic transducer 61 is transmitted to a sonic horn 65 connected to the sonic transducer 61. The sonic horn 65 amplifies the transmitted sonic vibration, and the tip of the sonic horn 65 vibrates at a frequency of the sound wave. The sonic horn 65 thus projects the sound wave generated by the sound wave generator 60 onto the surface of the coating film 200.

The position of the sonic horn 65 on the stage 10 is moved along the surface of the coating object 100 in the directions x and y by a horn moving mechanism 66 attached to the support 5. The horn moving mechanism 66 is controlled by the controller 30. The horn moving mechanism 66 can be a linear motor moving mechanism, a feed screw moving mechanism, or the like, for example. The sonic horn 65 can be moved by the horn moving mechanism 66 also in the direction z. The distance between the sonic horn 65 and the surface of the coating film 200 can be therefore adjusted by the controller 30. Moreover, it is possible to move the stage 10 with the position of the sonic horn 65 fixed.

The coating film 200 formed using the film forming apparatus 1 shown in FIG. 1 has thickness equalized by projection of the sound wave SW onto the surface of the coating film 200. This is because protrusions formed on the surface of the coating film 200 are flattened by sound pressure and the coating film 200 absorbs the sound wave energy and generates heat to decrease in viscosity. The frequency and intensity of the sound wave SW are selected according to the kind of the coating material 210.

Figure 3:
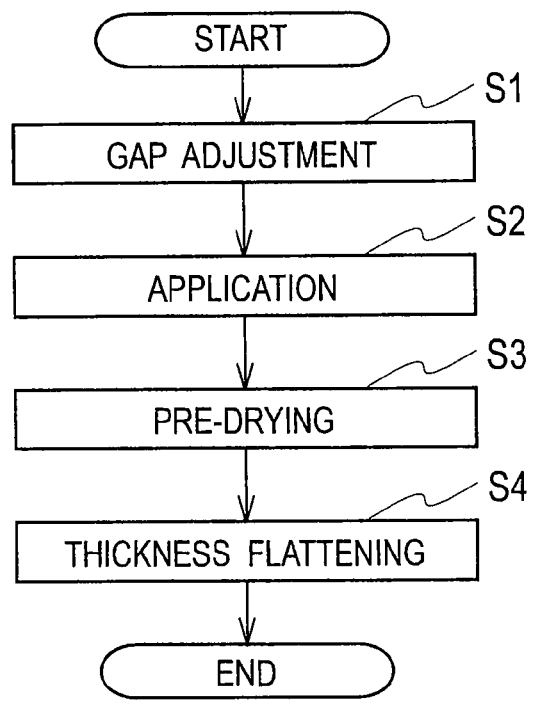
FIG. 3 is a flowchart for explaining a film forming method using the film forming apparatus according to the first embodiment.

FIG. 3 shows an example of the method of forming the coating film 200 using the film forming apparatus 1 shown in FIG. 1.

In step S1 of FIG. 3, gap adjustment is performed. Specifically, a not-shown height sensor moves over the stage 10 on which the coating object 100 is placed and acquires a profile concerning surface roughness of the coating object 100, or a height profile. Subsequently, in order to set the vertical distance (in the direction z) between the application nozzle 20 and the surface of the coating object 100 (hereinafter, referred to as a gap) to the setting value, the acquired height profile is used to calculate the difference between the setting value and an average of the height profile as a correction amount. The gap between the application nozzle 20 and the surface of the coating object 100 is adjusted by the calculated correction amount. If the gaps of the coating objects 100 do not vary so much, the gap adjustment is performed only for the first coating object 100 and is not performed thereafter.

In step S2, the stage 10 is rotated by the rotation mechanism 40 while the application nozzle 20 is linearly moved along the surface of the coating object 100 from the rotation center of the stage 10 toward the outer edge thereof by the application moving mechanism 50. At this time, the moving application nozzle 20 continuously discharges the coating material 210 onto the surface of the coating object to apply the coating material 210 to the surface of the coating object 100 (spiral coating). The coating film 200 is thus formed on the surface of the coating object 100.

In step S3, pre-drying of the coating film 200 is performed. In the pre-drying, in order to reduce the fluidity of the coating film 200 on the coating object 100, the stage 10 is rotated at a predetermined speed for a predetermined time to accelerate drying of the coating film 200. The drying of the coating film 200 is accelerated particularly in the outer edge, and the coating film 200 is prevented from expanding. If the fluidity of the coating film 200 is not a problem, the step of pre-drying can be omitted. By performing pre-drying after the application of the coating material 210 to the coating object 100, the coating film 200 dries to some extent to have less fluidity. This can prevent changes in film shape which may occur at the periphery of the coating object 100 in the film flattening process carried out later.

Figure 4A:
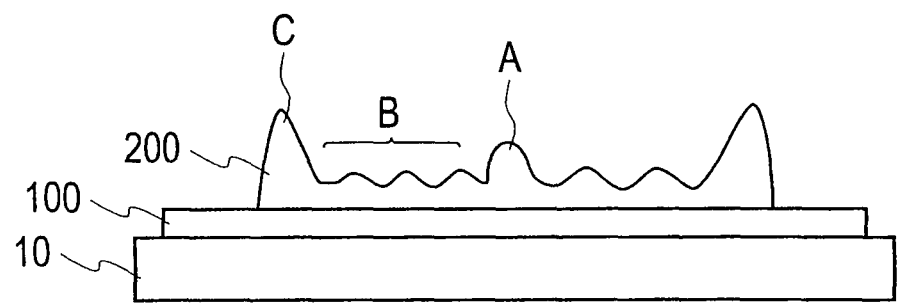
FIGS. 4A and 4B are schematic views for explaining flattening of a coating film using the film forming apparatus according to the first embodiment.
Figure 4B:
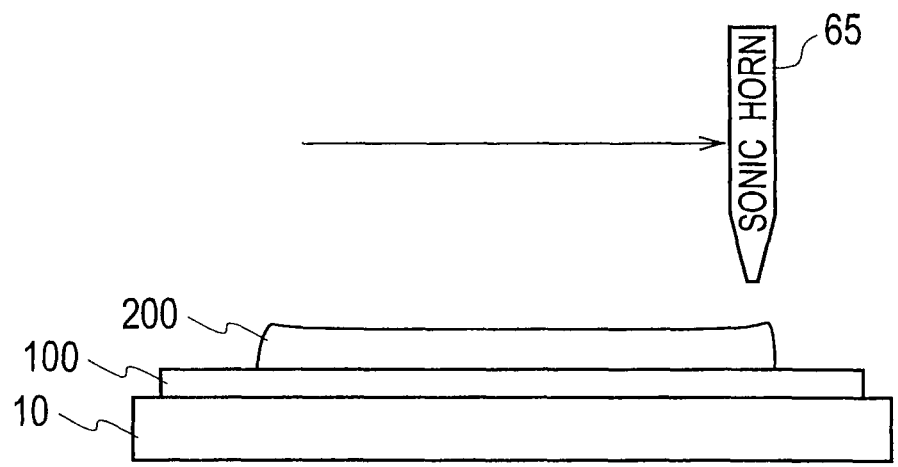

In step S4, the sound wave SW is projected onto the surface of the coating film 200 to flatten the thickness of the coating film 200. To be specific, the sonic horn 65 moves over the entire surface of the coating object 100 on the stage 10. At this time, the moving sonic horn 65 continuously projects the sound wave SW onto the coating film 200 on the coating object 100. The protrusions formed on the surface of the coating film 200 are therefore flattened by the sound pressure. Moreover, the viscosity of the coating film 200 is reduced by the sound wave energy to flatten the surface of the coating film 200. Accordingly, the starting point unevenness A, coating pitch unevenness B, and crown C in the periphery, which are shown in FIG. 4A, are flattened, and the flat coating film 200 is obtained as shown in FIG. 4B.

The controller 30 controls vibration of the sonic horn 65 so that the sound wave SW has enough energy to flatten the protrusions on the surface of the coating film 200 and reduce the viscosity of the coating film 200. The vibration of the sonic horn 65 is adjusted by controlling the vibration controller 62.

In the aforementioned example, the sound wave SW is projected onto the surface of the coating film 200 after the coating material 210 is applied to the entire surface of the coating object 100. However, the sound wave SW may be projected onto the surface of the coating film 200 while the coating material 210 is applied to the surface of the coating object 100. To be specific, the sonic horn 65 is moved to follow the application nozzle 20 which is discharging the coating material 210 onto the surface of the coating object 100. The sound wave SW is thus projected onto the surface of the application film 200 immediately after the coating film 200 is formed on the surface of the coating object 100. The surface of the coating film 200 is therefore flattened.

Figure 5:
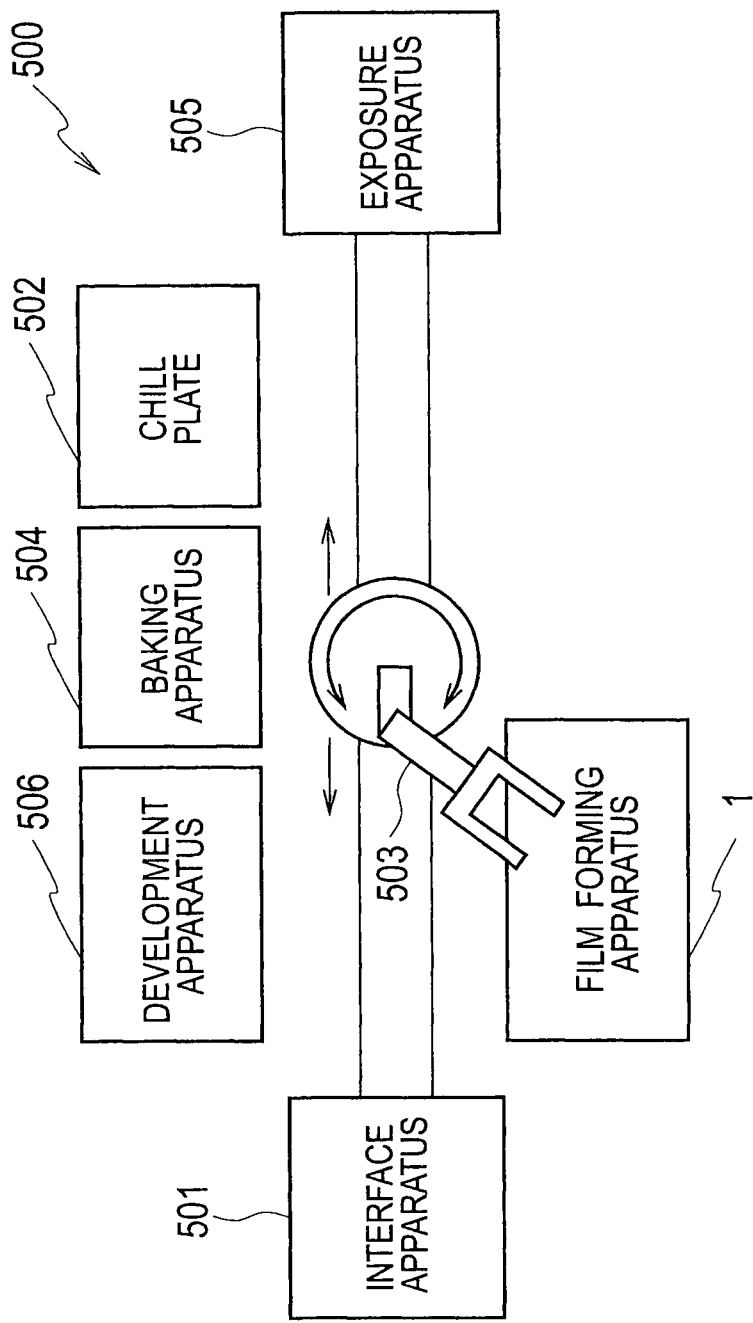
FIG. 5 is a schematic view showing a configuration of a film forming system including the film forming apparatus according to the first embodiment.
Figure 6:
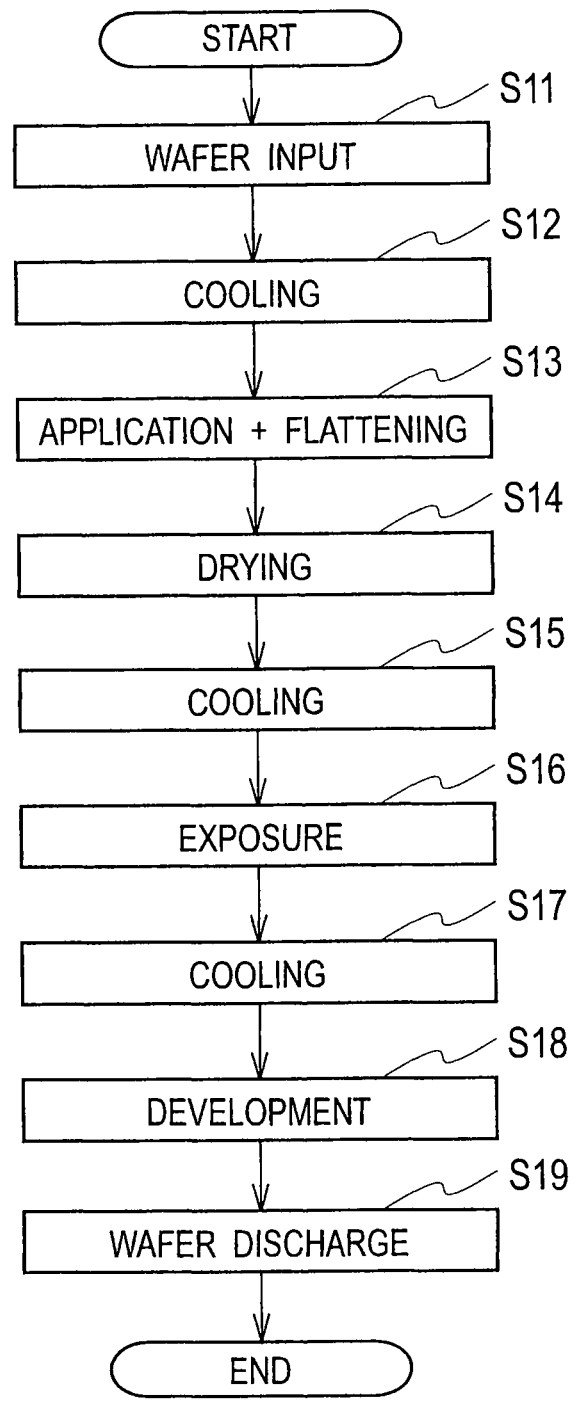
FIG. 6 is a flowchart for explaining a manufacturing process using the film forming system shown in FIG. 5.

With reference to the flowchart shown in FIG. 6, a description is given of a method of forming a photoresist film as the coating film 200 on a wafer as the coating object 100 by using a film forming system 500 (shown in FIG. 5) including the film forming apparatus 1 according to the first embodiment.

In step S11, wafers already subjected to rinsing or pretreatment are set at an interface apparatus 501 of the film forming system 500, and the film forming system 500 accepts the input of each wafer. Subsequently, in step S12, the wafer is transported to a chill plate 502 and is then cooled for a predetermined time on the chill plate 502.

After the predetermined time, the wafer is taken out from the chill plate 502 and is then transported to the film forming apparatus 1. In step S13, the material of the photoresist film is applied to the wafer by the film forming apparatus 1 and formed into the photoresist film, and the photoresist film is subjected to the film thickness flattening process. The coating and film thickness flattening process for the photoresist film in the step S13 are performed by the method explained with reference to FIG. 3.

The wafers are sequentially transported by a transportation apparatus 503 and are heated by a baking apparatus 504 in step S14. The photoresist film formed on each wafer is dried. In the step S15, the wafer is cooled by the chill plate 502, and the photoresist film on the wafer is exposed by an exposure apparatus 505 in the step S16.

In step S17, the wafer is again cooled by the chill plate 502, and in step S18, the photoresist film on the wafer is developed by the development apparatus 506, followed by rinsing. Thereafter, in step S19, the wafer is returned to the interface apparatus 501 by the transportation apparatus 503 and is outputted from the film forming system 500. The process is thus terminated.

As described above, according to the film forming apparatus 1 shown in FIG. 1, the sound wave SW is projected onto the surface of the coating film 200. This can reduce the coating pitch unevenness to flatten the surface of the coating film 200. Moreover, the sound wave SW is projected onto the center of the coating object 100 to reduce the starting point unevenness.

Figure 7A:
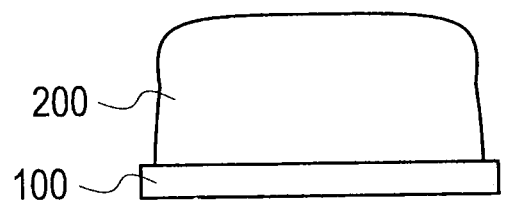
FIGS. 7A to 7C are schematic views showing formation of protrusions in the periphery of the coating film.
Figure 7B:
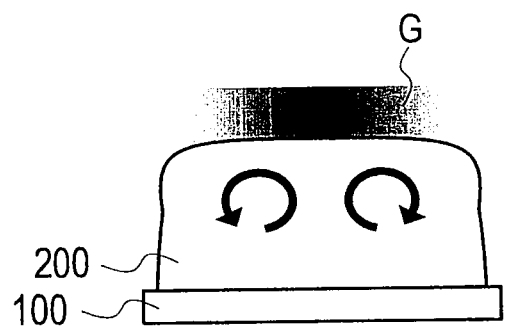
Figure 7C:
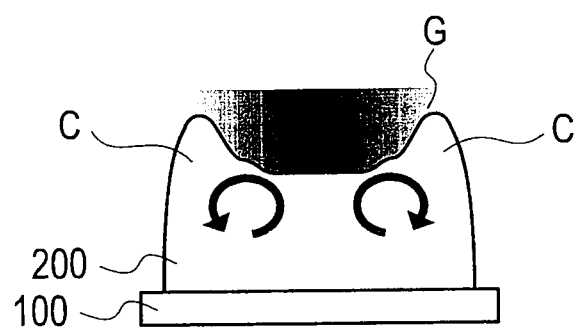

Moreover, as already described, the peripheral part of the coating film 200 dries very quickly and has a tendency to form protrusions (crown). FIGS. 7A to 7C show formation of the crown in the coating film 200 formed by applying a coating material containing a solute and a solvent to the surface of the coating object 100.

The coating film 200 just after the coating material is applied to the surface of the coating object 100 has a profile shown in FIG. 7A. For example, if the coating material is ink of organic electroluminescence (EL) and the coating object 100 is a glass substrate, the coating film 200 has a profile shown in FIG. 7A by adjusting the viscosity of the coating material, and controlling the wettability of the surface of the coating object 100.

When the coating film 200 starts to dry on the coating object 100, the solvent diffuses into the outside air from the surface of the coating film 200 to form a vapor layer G, and convection occurs within the coating film 200 as indicated by arrows. At this time, the peripheral part of the coating film 200 has a larger surface area than that of the central part. Moreover, the solvent has a lower density in the atmosphere around the peripheral part than that around the central part. Accordingly, the coating film 200 dries preferentially from the peripheral part. Since the solvent vaporizes quickly from the peripheral part, the surface tension increases and acts so as to pull the coating film 200. Accordingly, as shown in FIG. 7C, the coating film 200 has a concave profile with the periphery raised as a whole. If the solvent of the coating film 200 is highly volatile and dries excessively quickly, the coating film 200 has a profile shown in FIG. 7C when drying out. Accordingly, the formed coating film 200 is a concave solidified substance and has the crown C protruding in the periphery.

According to the film forming apparatus 1 shown in FIG. 1, the sound wave SW is projected onto the peripheral part of the coating film 200, thus flattening the crown formed in the peripheral part of the coating film 200.

According to the film forming apparatus 1, therefore, it is possible to provide a film forming apparatus and a film forming method which use spiral coating to increase the use efficiency of the coating material 210 and prevent degradation of the evenness in thickness of the coating film 200 formed on the coating object 100. Moreover, it is possible to provide an electronic device which is manufactured using the aforementioned film forming apparatus or method and has film thickness prevented from having reduced evenness.

Furthermore, if the coating film 200 is formed by spin coating, the material scattering or turned into mist sticks to the side and rear surfaces of the substrate during the application. It is therefore necessary to perform processes called edge cut and back rinse after the application process to remove the sticking material using thinner. A lot of thinner is used at these processes, resulting in large burden on the environment. However, according to the film forming apparatus 1 shown in FIG. 1, the processes including edge cut and back rinse are unnecessary, and the thinner usage can be significantly reduced.

Modification

Figure 8:
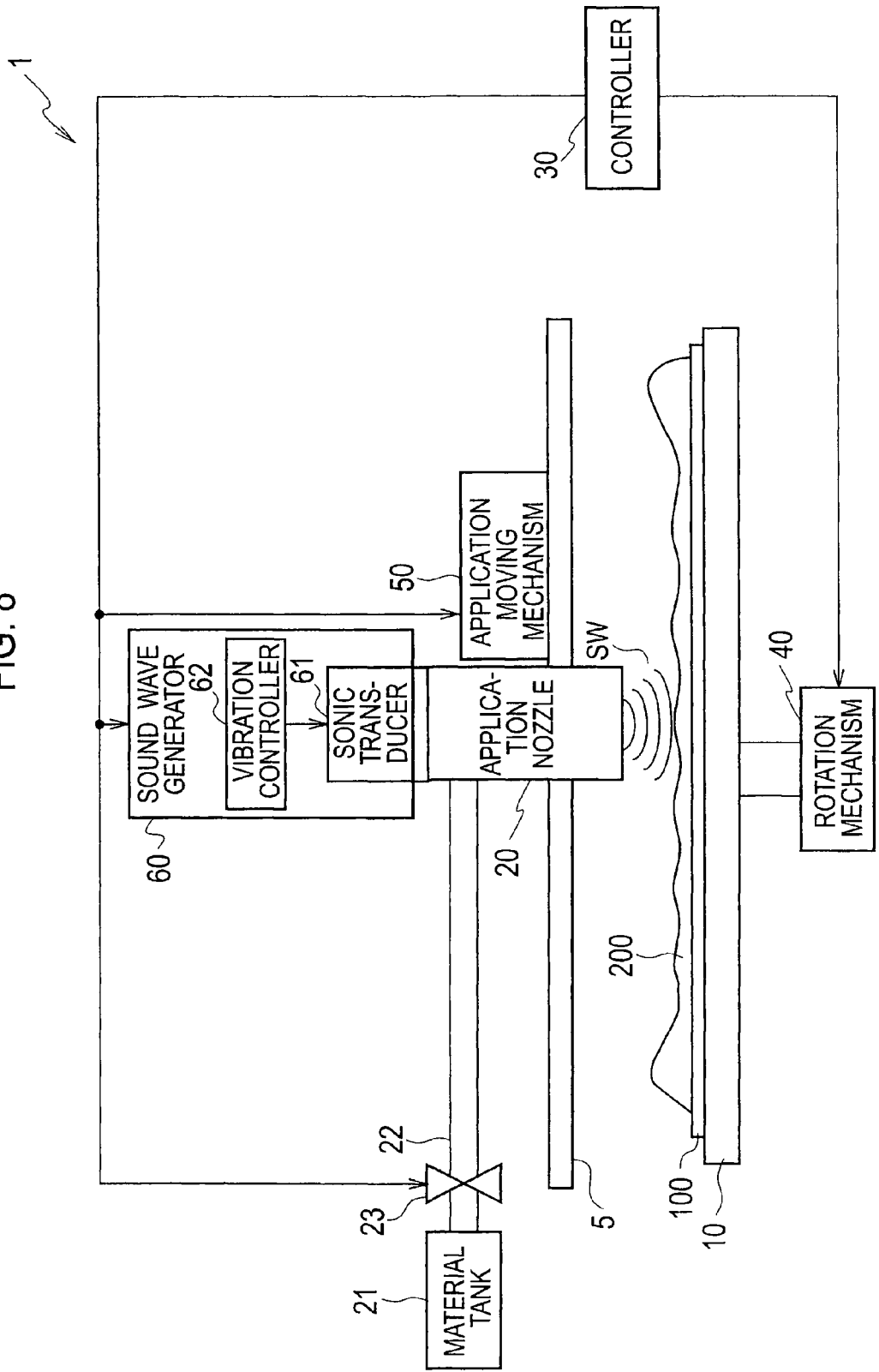
FIG. 8 is a schematic view showing a configuration of a film forming apparatus according to a modification of the first embodiment.

FIG. 8 shows a film forming apparatus 1 according to a modification of the first embodiment. In the film forming apparatus 1 shown in FIG. 8, the sonic transducer 61 of the sound wave generator 60 is attached to the application nozzle 20. The sound wave generator 60 vibrates the application nozzle 20, and the sound wave SW is projected from the application nozzle 20 onto the surface of the coating film 200. This eliminates the need for the sonic horn 65 and can miniaturize the film forming apparatus 1.

In the film forming apparatus 1 shown in FIG. 8, for example, the application nozzle 20 is moved over the stage 10 while the sound wave SW is projected from the coating nozzle 20 onto the surface of the coating film 200 after the coating material 210 is applied to the entire surface of the coating object 100.

Alternatively, the sound wave SW may be projected from the application nozzle 20 onto the surface of the coating film 200 while the coating material 210 is supplied from the application nozzle 20 to the surface of the coating object 100. In other words, the coating film 200 can be formed on the surface of the coating object 100 while the coating material 210 is subjected to flattening just after being supplied to the coating object 100.

Second Embodiment

Figure 9:
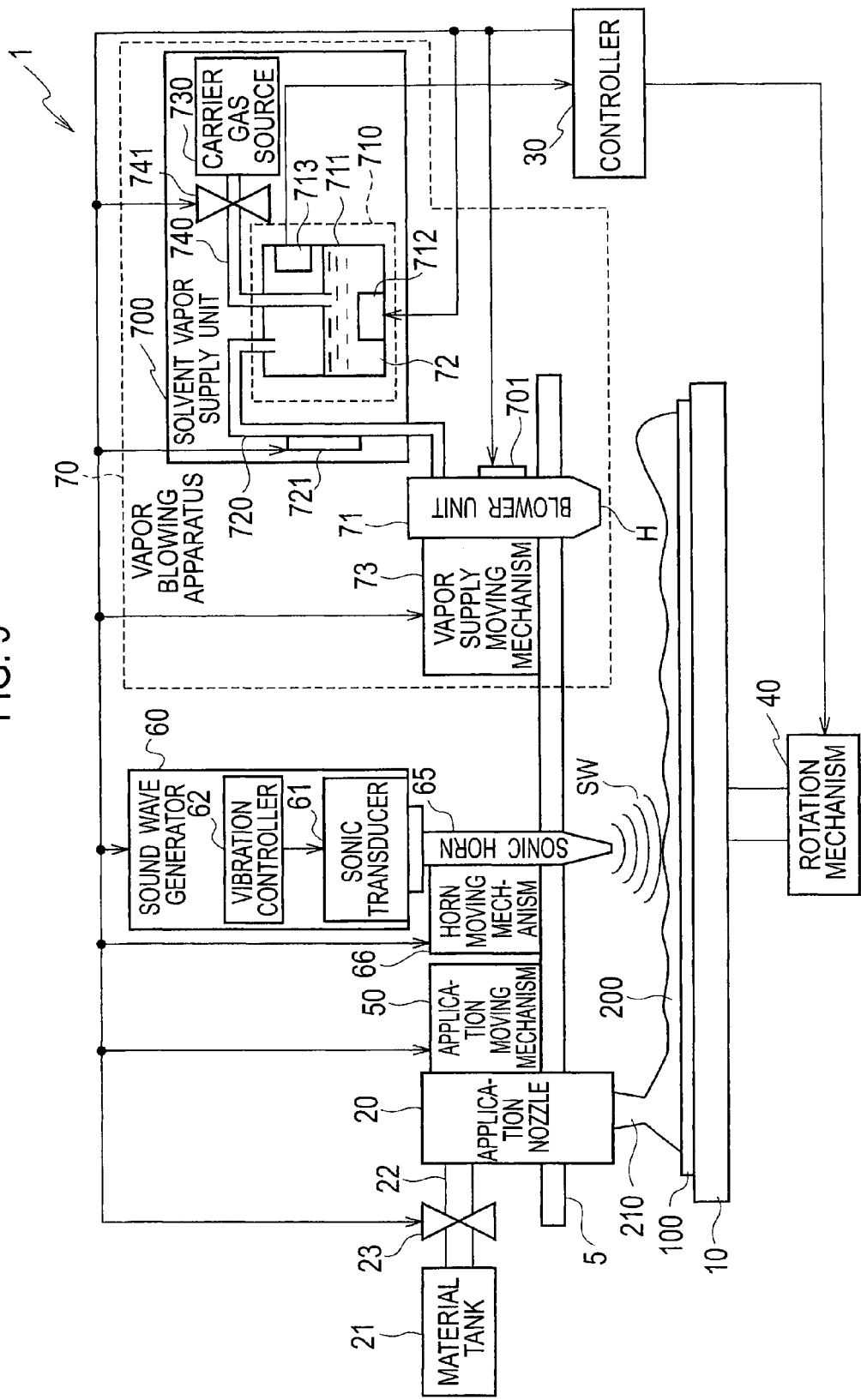
FIG. 9 is a schematic view showing a configuration of a film forming apparatus according to a second embodiment.

As shown in FIG. 9, a film forming apparatus 1 according to a second embodiment differs from the film forming apparatus 1 shown in FIG. 1 in further including a vapor blowing apparatus 70. The vapor blowing apparatus 70 blows vapor of the solvent dissolving the coating material 210 (hereinafter, referred to as solvent vapor) onto the surface of the coating film 200 formed on the coating object 100. The other configuration is the same as that of the first embodiment shown in FIG. 1.

The vapor blowing apparatus 70 includes: a blower unit 71 blowing the solvent vapor onto the surface of the coating film 200; and a solvent vapor supply unit 700 supplying the solvent vapor onto the blower unit 71.

The solvent vapor supply unit 700 includes a solvent vapor generator 710, a vapor line 720, a carrier gas supply section 730, and a gas supply line 740. The solvent vapor generator 710 generates the solvent vapor. The vapor line 720 serves as a channel to feed the solvent vapor from the solvent vapor generator 710 to the blower unit 71. The carrier gas supply section 730 supplies carrier gas to the solvent vapor generator 710. The carrier gas is used to feed the solvent vapor generated by the solvent vapor generator 710 to the blower unit 71. The gas supply line 740 is a channel of the carrier gas supplied from the carrier gas supply section 730 to the solvent vapor generator 710.

The solvent vapor generator 710 includes: a solvent tank 711 reserving solvent 72; a solvent heater 712 heating the solvent 72 in the solvent tank 711; and a solvent temperature sensor 713 measuring temperature of the solvent vapor in the solvent tank 711. The solvent heater 712 and solvent temperature sensor 713 are electrically connected to the controller 30.

The controller 30 adjusts the temperature of the solvent heater 712 based on the temperature of the solvent vapor measured by the solvent temperature sensor 713 so that the solvent 72 in the solvent tank 711 turns into vapor.

The vapor line 720 is a channel to feed the solvent vapor from the solvent vapor generator 710 to the blower unit 71. The vapor line 720 is a tube, a pipe, or the like, for example. The vapor line 720 is provided with a vapor line heater 721 heating the vapor line 720. The vapor line heater 721 is a sheet-type heater wrapped around the outer circumferential surface of the vapor line 720, for example. The vapor line heater 721 is electrically connected to the controller 30, which controls the temperature of the vapor line 720 so that the temperature of the vapor line 720 is higher than the dew point of the solvent 72.

If the temperature of the vapor line 720 is lower than the dew point of the solvent 72, for example, the vapor of the solvent 72 in the carrier gas within the vapor line 720 is condensed. It is therefore difficult to obtain a desired amount of solvent vapor. However, by adjusting the temperature of the vapor line 720 with the vapor line heater 721, the solvent vapor within the vapor line 720 is maintained at a temperature range in which the solvent vapor will not be condensed.

The carrier gas supply section 730 reserves the carrier gas and supplies the carrier gas to the solvent vapor generator 710. The solvent vapor generated at the solvent vapor generator 710 is fed with the carrier gas to the blower unit 71 to be blown out. Examples of the carrier gas are inert gas such as nitrogen and air.

The gas supply line 740 is a channel to supply the carrier gas from the carrier gas supply section 730 to the solvent vapor generator 710. The gas supply line 740 is a tube, a pipe, or the like, for example. The gas supply line 740 is provided with a flow rate regulation valve 741 which regulates the flow rate of the carrier gas. The flow rate regulation valve 741 is electrically connected to the controller 30. According to the control by the controller 30, the flow rate of carrier gas from the carrier gas supply section 730 is adjusted.

The blower unit 71 blows the solvent vapor fed from the solvent vapor generator 710 through the vapor line 720, which is an air knife-type gas supply unit, for example. The blower unit 71 is box-shaped and includes a slit-formed supply outlet H, for example. On the side surface the blower unit 71, a blower unit heater 701 which heats the blower unit 71 is provided. The blower unit heater 701 can be a sheet-type heater attached to the outer circumferential surface of the blower unit 71, for example. The blower unit 701 is electrically connected to the controller 30, which controls the temperature of the blower unit 71 so that the temperature of the blower unit 71 is higher than the dew point of the solvent 72.

For example, similarly to the aforementioned vapor line 720, when the temperature of the blower unit 71 is lower than the dew point of the solvent 72, the vapor of the solvent 72 within the carrier gas is condensed. This makes it difficult to obtain a desired amount of solvent vapor. However, by adjustment of the blower unit heater 701, the temperature of the blower unit 71 is maintained in a temperature range in which the solvent vapor in the blower unit 71 will not be condensed.

The position of the blower unit 71 on the stage 10 is moved in the directions x and y along the surface of the coating object 100 by a supplier moving mechanism 73 attached to the support 5. The vapor supply moving mechanism 73 is controlled by the controller 30. The vapor supply moving mechanism 73 can be a linear motor moving mechanism, a feed screw moving mechanism, or the like, for example. The vapor supply moving mechanism 73 can move the blower unit 71 also in the direction z. Accordingly, the distance between the blower unit 71 and the surface of the coating film 200 can be adjusted by the controller 30. Moreover, it is possible to move the stage 10 with the position of the blower unit 71 fixed.

In the film forming apparatus 1 shown in FIG. 9, at the film thickness flattening process of the step S4 in FIG. 3, for example, the solvent vapor is blown onto the entire surface of the coating film 200 after the sound wave SW is projected onto the entire surface of the coating film 20.

Specifically, the blower unit 71 moves over the entire surface of the coating object 100 on the stage 10. At this time, the blower unit 71 moves along the surface of the coating film 200 while continuously blowing the solvent vapor onto the coating film 200 formed on the coating object 100, thus dissolving the surface layer of the coating film 200 (re-dissolution). The controller 30 controls the rate of blown solvent vapor (supply rate) so as to lower the viscosity of the surface layer of the coating film 200. The rate of blown solvent vapor is adjusted by using the flow rate regulation valve 741 to regulate the flow rate of carrier gas, changing the temperature setting of the solvent vapor generator 710, or performing the both.

In the example described above, the solvent vapor is blown onto the entire surface of the coating film 200 after the sound wave SW is projected onto the entire surface of the coating film 200. However, the solvent vapor may be blown onto the entire surface of the coating film 200 before the sound wave SW is projected onto the entire surface of the coating film 200. Alternatively, the solvent vapor may be blown onto the surface of the coating film 200 at the same time as the sound wave SW is projected onto the surface of the coating film 200. In short, the process of projecting the sound wave SW onto the surface of the coating film 200 and the process of blowing the solvent vapor can be performed in any order.

Alternatively, the solvent vapor may be blown onto the surface of the coating film 200 while the coating material 210 is applied to the surface of the coating object 100. For example, the blower unit 71 blowing the solvent vapor onto the coating film 200 is moved to follow the application nozzle 20 discharging the coating material 210 onto the surface of the coating object 100. By blowing the solvent vapor onto the surface of the coating film 200 just after the coating film 200 is formed on the surface of the coating object 100, the surface of the coating film 200 is flattened. Furthermore, the coating material 210 may be applied to the surface of the coating object 100 while the sound wave SW is projected onto the surface of the coating film 200 and the solvent vapor is blown onto the same.

Moreover, the solvent vapor may be blown onto the surface of the coating object 100 before the coating film 200 is formed on the surface of the coating object 100. When the solvent vapor is previously blown onto the surface of the coating object 100, the coating film 200 formed on the surface of the coating object 100 has a low viscosity. The coating film 200 can be therefore flattened.

According to the film forming apparatus 1 according to the second embodiment, the coating film 200 can be flattened by projecting the sound wave SW and blowing the solvent vapor onto the coating film 200. Accordingly, it is possible to provide a film forming apparatus and a film forming method which prevents the reduction of evenness in thickness of the coating film 200 formed on the coating object 100, and moreover provide an electronic device which is manufactured using the aforementioned film forming apparatus or method and includes a film thickness prevented from having poor evenness. The others are substantially the same as those of the first embodiment, and the redundant description is omitted.

First Modification

Figure 10:
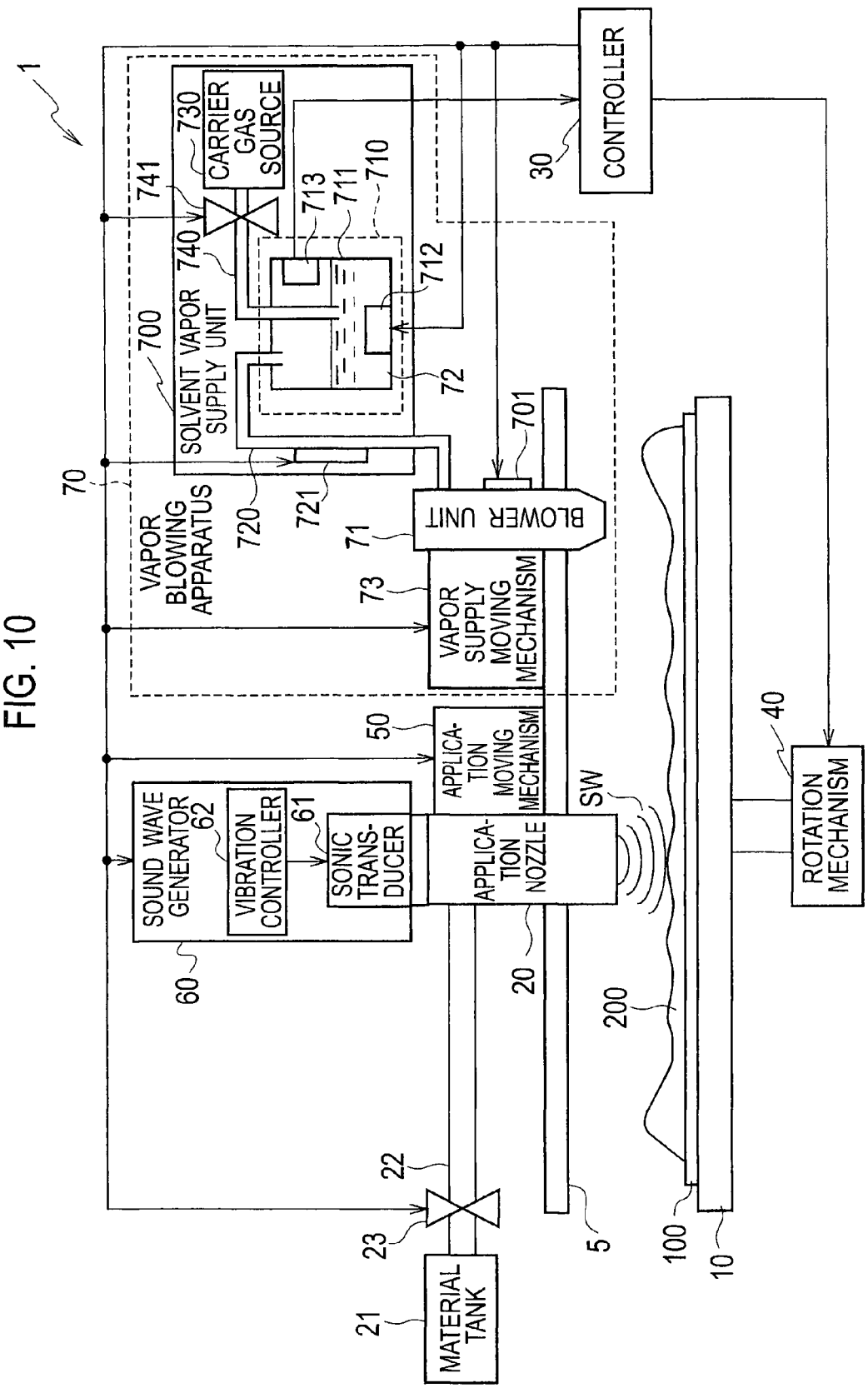
FIG. 10 is a schematic view showing a configuration of a film forming apparatus according to a first modification of the second embodiment.

FIG. 10 shows a film forming apparatus 1 according to a first modification of the second embodiment. FIG. 9 shows the example in which the sound wave SW generated by the sound wave generator 60 is projected onto the surface of the coating film 200 by the sonic horn 65. However, as shown in FIG. 10, the sonic transducer 61 of the sound wave generator 60 may be attached to the application nozzle 20 so that the sound wave SW is projected from the application nozzle 20 onto the surface of the coating film 200.

Using the film forming apparatus 1 shown in FIG. 10, for example, the sound wave SW may be projected onto the surface of the coating film 200 from the application nozzle 20 while the application nozzle 20 is moved over the stage 10 after the coating material 210 is applied to the entire surface of the coating object 100. Alternatively, the sound wave SW may be projected from the application nozzle 20 onto the surface of the coating film 200 while the coating material 210 is supplied from the application nozzle 20 onto the surface of the coating object 100.

Second Modification

Figure 11:
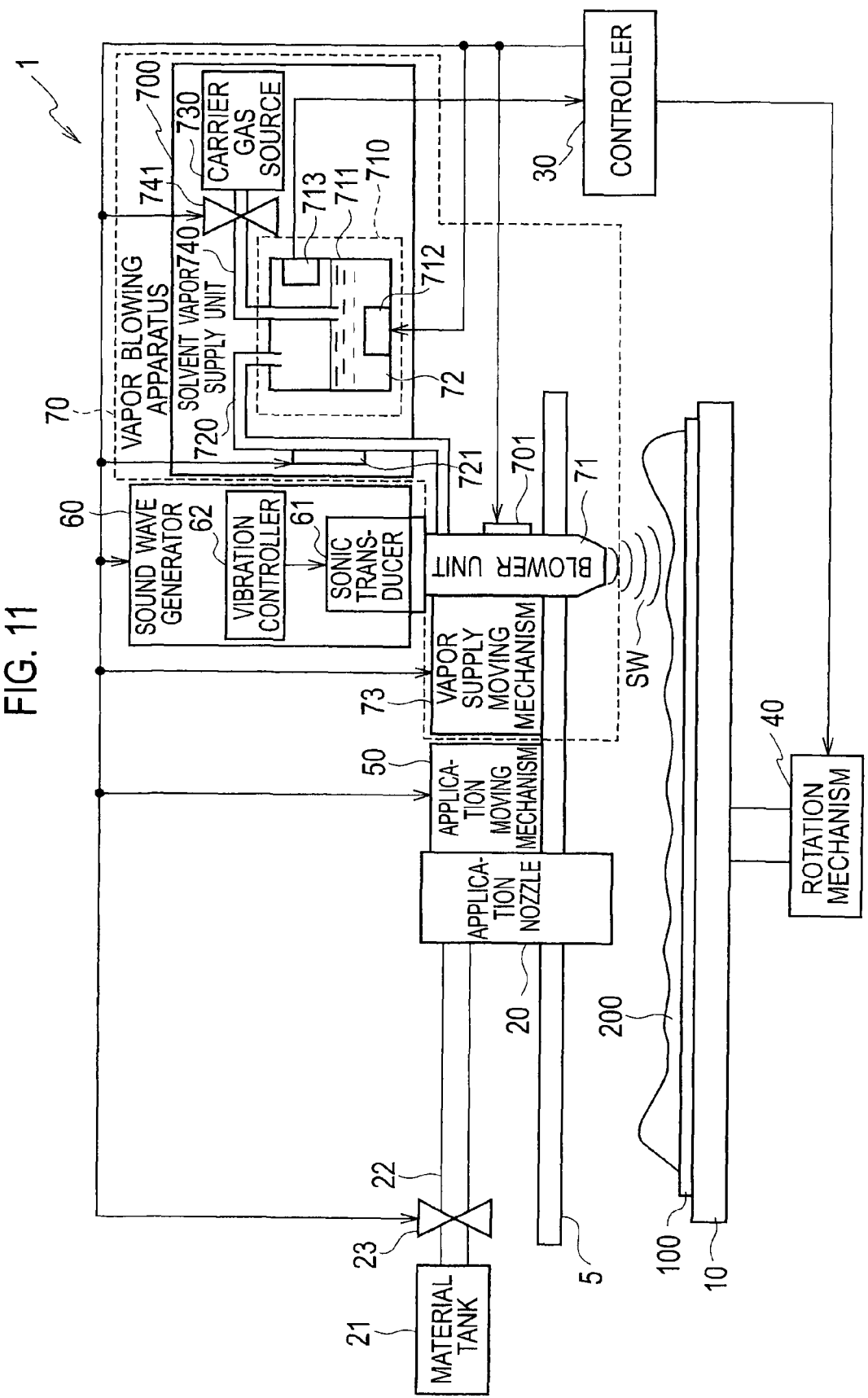
FIG. 11 is a schematic view showing a configuration of a film forming apparatus according to a second modification of the second embodiment.

FIG. 11 shows a film forming apparatus 1 according to a second modification of the second embodiment. In the film forming apparatus 1 shown in FIG. 11, the sonic transducer 61 of the sound wave generator 60 is attached to the blower unit 71. The sound wave generator 60 vibrates the blower unit 71, and the sound wave SW is projected from the blower unit 71 onto the surface of the coating film 200. The attachment of the sonic transducer 61 to the blower unit 71 eliminates the need for the sonic horn 65, thus miniaturizing the film forming apparatus 1.

Using the film forming apparatus 1 shown in FIG. 10, for example, the sound wave SW may be projected onto the surface of the coating film 200 from the blower unit 71 moving over the stage 10 after the coating material 210 is applied to the entire surface of the coating object 100.

Alternatively, vapor of the solvent dissolving the coating material 210 may be blown onto the surface of the coating film 200 from the blower unit 71 while the blower unit 71 is vibrated by the sound wave generator 60. In other words, the solvent vapor may be blown from the blower unit 71 onto the coating film 200 while the sound wave SW is projected onto the surface of the coating film 200 from the blower unit 71.

In the film forming method using the film forming apparatus shown in FIG. 10 or 11, as described above, the flattening of the surface of the coating film 200 by the sound wave SW and the flattening of the surface of the coating film 200 by the solvent vapor may be performed in any order and may be performed simultaneously. Furthermore, the coating film 200 may be subjected to flattening while the coating material 210 is applied to the surface of the coating object 100.

Third Embodiment

Figure 12:
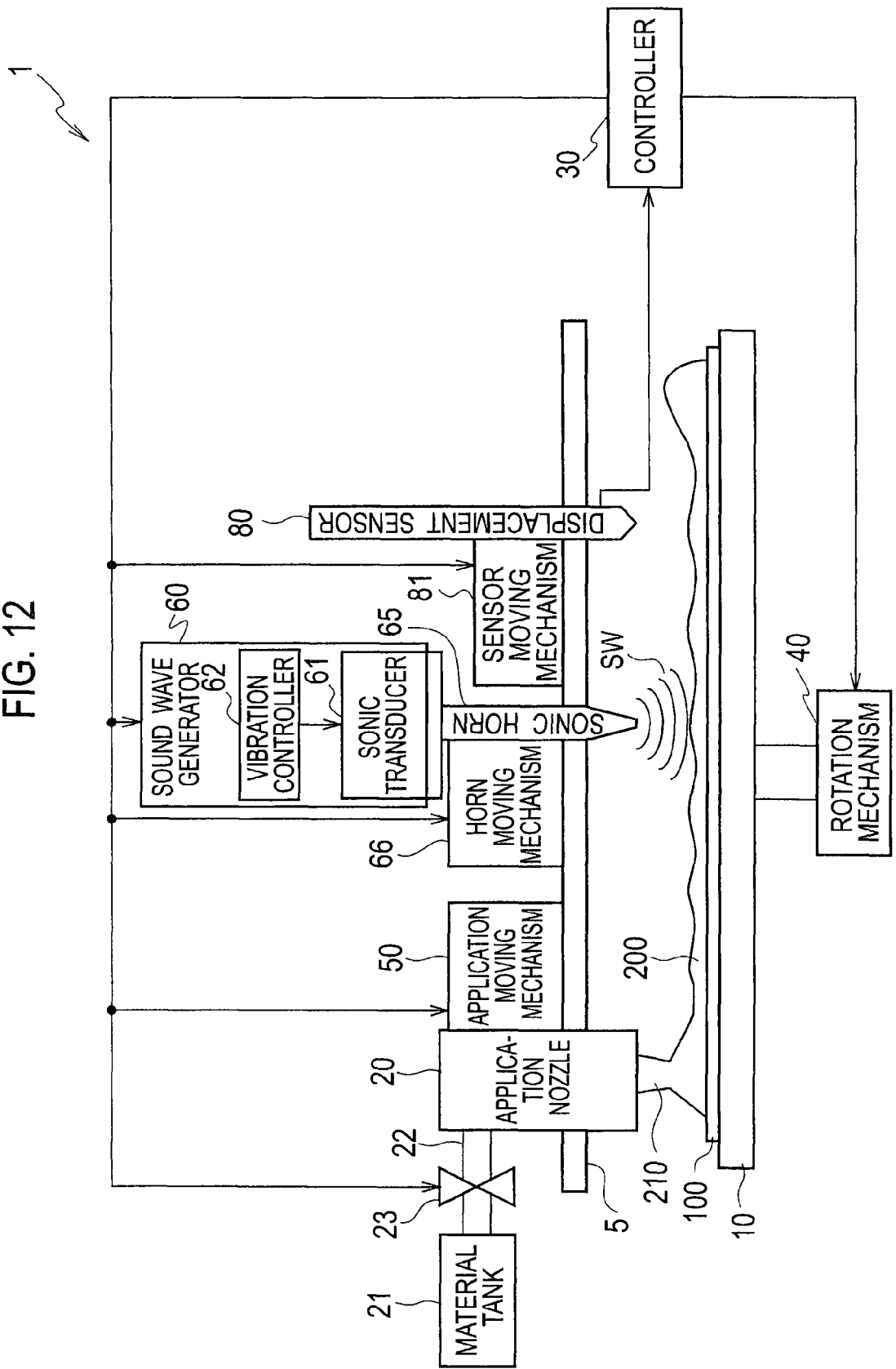
FIG. 12 is a schematic view showing a configuration of a film forming apparatus according to a third embodiment.

A film forming apparatus 1 according to a third embodiment shown in FIG. 12 differs from the film forming apparatus 1 shown in FIG. 1 in further including a displacement sensor 80 which detects displacement of the profile of the coating film 200 on the coating object 100. The other configuration is the same as that of the first embodiment shown in FIG. 1.

The position of the displacement sensor 80 on the stage 10 is moved in the directions x and y along the surface of the coating object 100 by a sensor moving mechanism 81 attached to the support 5. The sensor moving mechanism 81 is controlled by the controller 30. The sensor moving mechanism 81 can be a linear motor moving mechanism, a feed screw moving mechanism, or the like, for example. It is also possible to move the stage 10 with the position of the displacement sensor 81 fixed.

In the film forming apparatus 1 shown in FIG. 12, for example, after the coating material 210 is applied to the entire surface of the coating object 100 to form the coating film 200, the displacement of the profile of the coating film 200 is detected by the displacement sensor 80. The displacement of the profile of the coating film 200 detected by the displacement sensor 80 is transmitted to the controller 30, which then controls the vibration controller 62 according to the displacement of the profile of each region of the coating film 200. Specifically, according to the thickness of each region, the projection conditions are adjusted, including the amplitude and frequency of the sound wave SW to be projected onto the region and the distance between the sonic horn 65 and the coating film 200. To be specific, in a region with a larger thickness, the amplitude of the sound wave SW is set larger, the frequency thereof is set higher, or the distance between the sonic horn 65 and coating film 200 is set shorter.

Figure 13A:
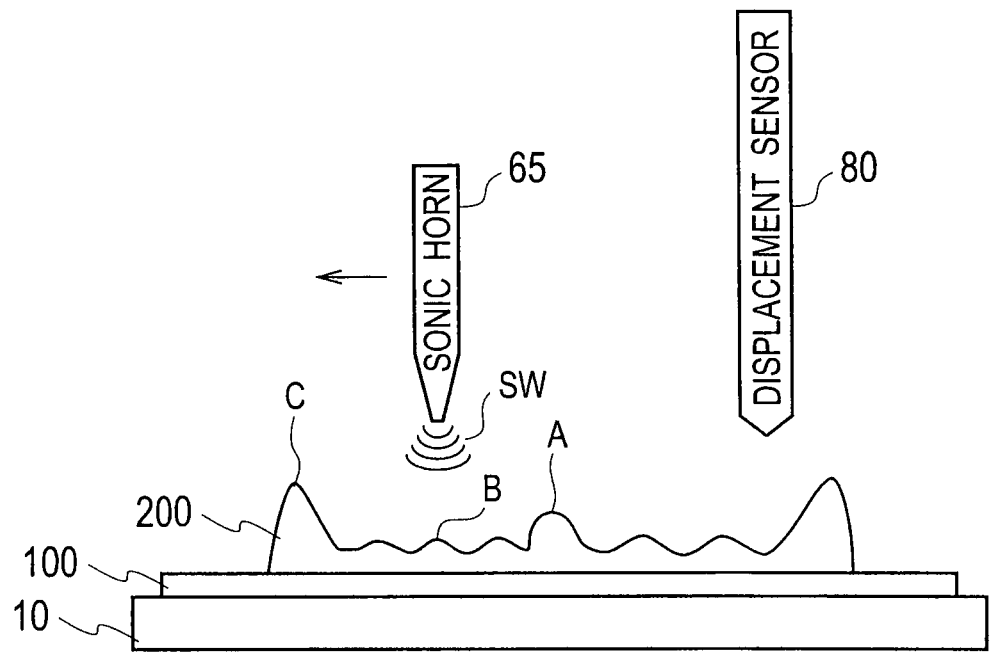
FIGS. 13A and 13B are schematic views for explaining an example of a method of flattening a coating film by the film forming apparatus according to the third embodiment.

As shown in FIG. 13A, for example, it is assumed that the sonic horn 65 moves at a constant speed above the coating film 200 in parallel to the same. In a region of the surface of the coating film 200 including pronounced protrusions, the driving voltage Vd to be supplied to the sonic transducer 61 is increased to increase the amplitude of the sonic horn 65 and therefore increase the flattening effect.

Figure 13B:
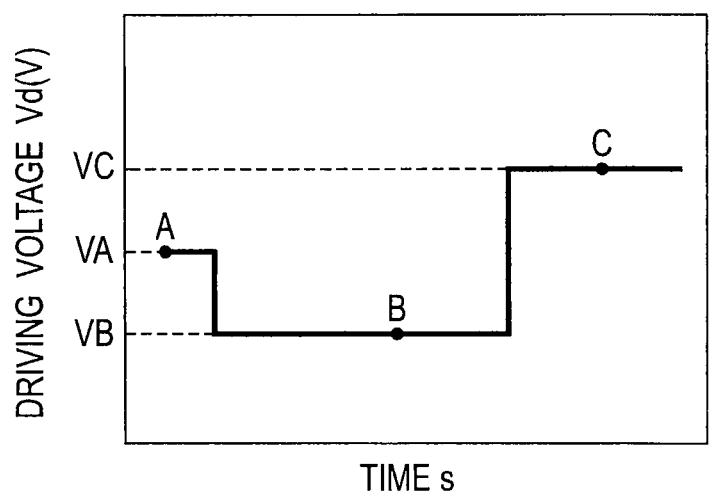

In the example shown in FIG. 13A, the crown C in the periphery has the highest protrusions, followed by the starting point unevenness A and the coating pitch unevenness B. Accordingly, magnitudes VC, VA, and VB of the driving voltage Vd have a relation of VC>VA>VB as shown in FIG. 13B. Herein, the magnitude VC is a magnitude of the driving voltage Vd when the sound wave SW is projected onto the crown C in the periphery; the magnitude VA is a magnitude of the driving voltage Vd when the sound wave SW is projected onto the starting point unevenness A, and the magnitude VB is a magnitude of the driving voltage Vd when the sound wave SW is projected onto the coating pitch unevenness B.

Moreover, the sonic horn 65 is moved above the protrusions on the surface of the coating film 200, and the sound wave SW may be projected for longer time onto the higher protrusions with the driving voltage Vd maintained constant. In order to flatten the coating film 200, the sonic horn 65 may be moved closer to the coating film 200 to increase the transmission efficiency of the sound wave SW in a region including higher protrusions.

Moreover, the frequency of the sound wave SW to be projected is adjusted to a structural frequency of the high polymer material such as the organic solvent and the solute contained in the coating material 210, or is adjusted to the harmonic frequencies thereof. This accelerates absorption of the sound wave SW by the coating film 200, thus increasing the fluidity.

According to the film forming apparatus 1. shown in FIG. 12, therefore the characteristics of the sound wave SW to be projected onto the coating film 200 and the like are adjusted according to the previously obtained distribution of thickness of the coating film 200. The coating film 200 can be therefore flattened precisely.

The displacement of the profile of the coating film 200 may be detected by the displacement sensor 80 while the coating material 210 is applied to the surface of the coating object 100. For example, the displacement sensor 80 is moved to follow the application nozzle 20 which is discharging the coating material 210 onto the surface of the coating object 210. The displacement of the surface profile of the coating film 200 immediately after the coating film 200 is formed on the surface of the coating object 100 is thus detected. According to the result of detection, the sound wave SW is projected onto the surface of the coating film 200 to flatten the coating film 200.

The displacement of the profile of the coating film 200 may be detected by the displacement sensor 80 after the sound wave SW is projected onto the surface of the coating film 200 for the first flattening. Accordingly, it is possible to detect the region which is not completely flattened by the first flattening process and further perform flattening of the region.

Moreover, the displacement of the surface profile of the coating object 100 or the displacement of the surface profile of the stage 10 on which the coating object 100 is placed is detected by the displacement sensor 80 before the coating film 200 is formed on the coating object 100. To be specific, the displacement of the surface profile of the coating object 100 before the coating film 200 is formed and the displacement of the surface profile of the coating film 200 formed on the coating object 100 are individually detected. The results of detecting the displacements of the surface of the coating object 100 and the surface of the coating film 200 are compared for extraction of a part of the coating film 200 to be flattened. For example, when the height and position of protrusions detected on the surface of the coating object 100 coincide with those of protrusions detected on the surface of the coating film 200, the protrusions on the surface of the coating object 100 just reflect the protrusions on the surface of the coating object 100. In this case, it is determined that the protrusions on the surface of the coating object 100 are not necessary to be flattened. This makes it possible to form the coating film 200 with a uniform thickness along the surface of the coating object 100 even when the coating object 100 with the coating film 200 not yet formed thereon does not have a flat surface.

According to the film forming apparatus 1 according to the third embodiment, the displacement of the surface profile of the coating film 200 is detected. Accordingly, the flattening process can be executed according to the distribution of thickness of the coating film 200, or the part necessary to be flattened can be selectively flattened. It is therefore possible to provide a film forming apparatus and a film forming method which are capable of preventing the reduction of evenness in thickness of the coating film 200 formed on the coating object 100, and moreover to provide an electronic device which is manufactured using the aforementioned film forming apparatus or method and has a film thickness with the reduction of unevenness prevented. The others are substantially the same as those of the first embodiment, and the redundant description is omitted.

First Modification

FIG. 14 shows a film forming apparatus 1 according to a first modification of a third embodiment. FIG. 12 shows the example where the sound wave generated by the sound wave generator 60 is projected onto the coating film 200 by the sonic horn 65. However, as shown in FIG. 14, the sonic transducer 61 of the sound wave generator 60 may be attached to the application nozzle 20 to project the sound wave SW through the application nozzle 20 onto the surface of the coating film 200.

Second Modification

Figure 15:
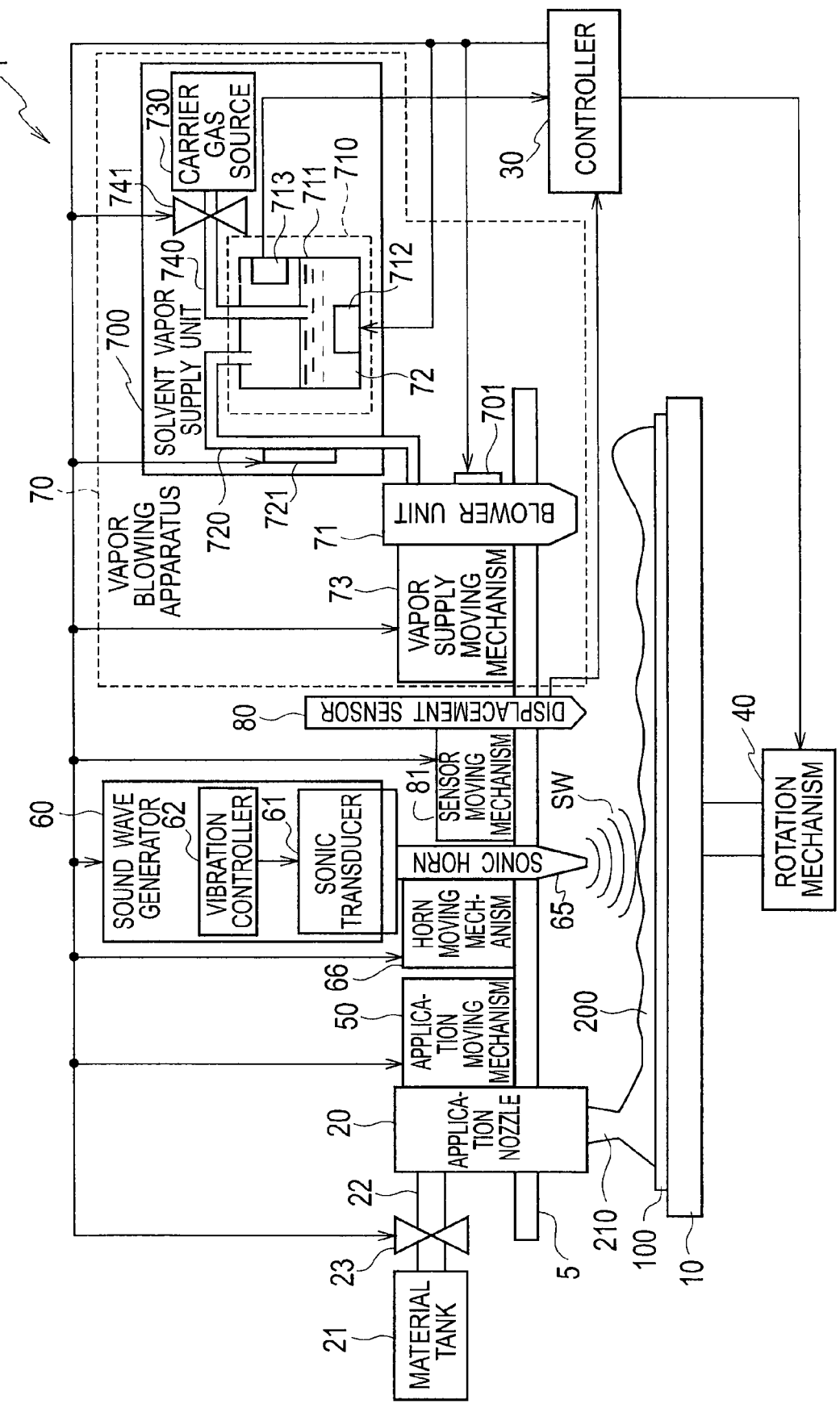
FIG. 15 is a schematic view showing a configuration of a film forming apparatus according to a second modification of the third embodiment.

FIG. 15 shows a film forming apparatus 1 according to a second modification of the third embodiment. The film forming apparatus 1 shown in FIG. 15 differs from the film forming apparatus 1 shown in FIG. 12 in further including the vapor blowing apparatus 70. According to the film forming apparatus 1 shown in FIG. 15, the coating film 200 can be flattened by projecting the sound wave SW and by blowing the solvent vapor onto the coating film 200, while detecting the displacement of the surface profile of the coating film 200 with the displacement sensor 80.

The controller 30 controls the vapor blowing apparatus 70 according to the displacement of the profile of each region of the coating film 200. According to the thickness of each region, the blowing conditions are adjusted, including the supply amount, temperature and flow rate of the solvent vapor to be blown onto the region, and the distance between the blower unit 71 and the coating film 200. To be specific, for a region with a larger thickness, the supply amount or flow rate of the solvent vapor is set higher, the temperature thereof is set higher, and the distance between the blower unit 71 and coating film 200 is set shorter.

Figure 16A:
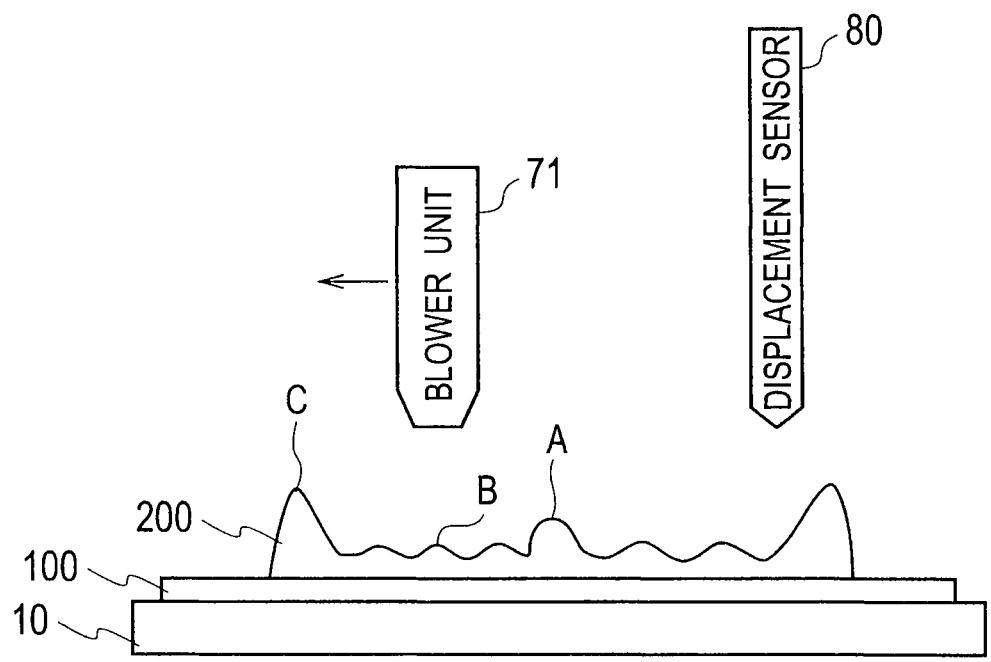
FIGS. 16A and 16B are schematic views for explaining an example of a method of flattening a coating film by the film forming apparatus according to the second modification of the third embodiment.

For example, it is assumed that the blower unit 71 moves over the coating film 200 at a constant speed in parallel to the same as shown in FIG. 16A. In a region of the surface of the coating film 200 having pronounced protrusions, opening Q of the flow rate regulation valve 741 is increased to increase the supply amount of the solvent vapor and increase the flattening effect.

Figure 16B:
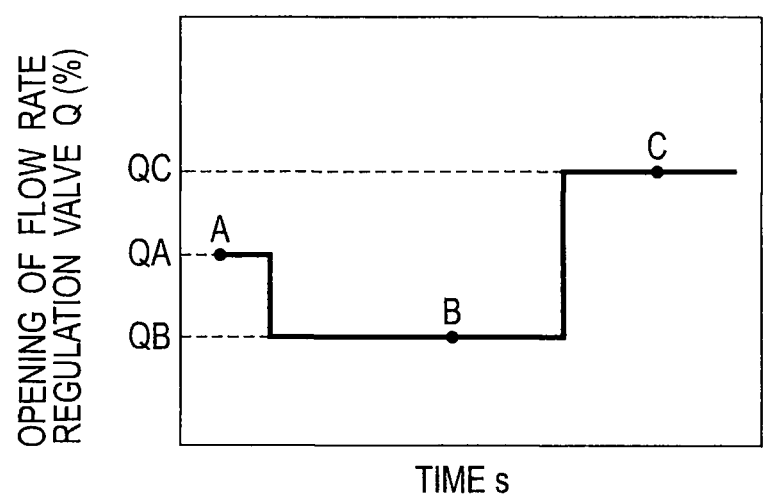

In the example shown in FIG. 16A, the crown C in the periphery has the highest protrusions, followed by the starting point unevenness A and the coating pitch unevenness B. Accordingly, magnitudes QC, QA, and QB of opening Q have a relation of QC>QA>QB as shown in FIG. 16B. Herein, the magnitude QC is a magnitude of the opening Q when the sound wave SW is projected onto the crown C in the periphery, the magnitude QA is a magnitude of the opening Q when the sound wave SW is projected onto the starting point unevenness A, and the magnitude QB is a magnitude of the opening Q when the sound wave SW is projected onto the coating pitch unevenness B.

Moreover, in order to increase the flattening effect in the crown C including the highest protrusions, the temperature of the solvent vapor may be increased by the blower unit heater 701 provided for the blower unit 71 when the blower unit 71 passes over the crown C.

Moreover, the blower unit 71 may be moved over the protrusions on the surface of the coating film 200 to supply the solvent vapor for longer time to a region including higher protrusions. In order to obtain a locally high flattening effect, the blower unit 71 may be brought close to the coating film 200.

According to the film forming apparatus 1 shown in FIG. 15, the amount of solvent vapor to be blown onto the coating film 200 or the like is adjusted according to the obtained distribution of thickness in the coating film 200. The coating film 200 can be therefore flattened more precisely.

Figure 17:
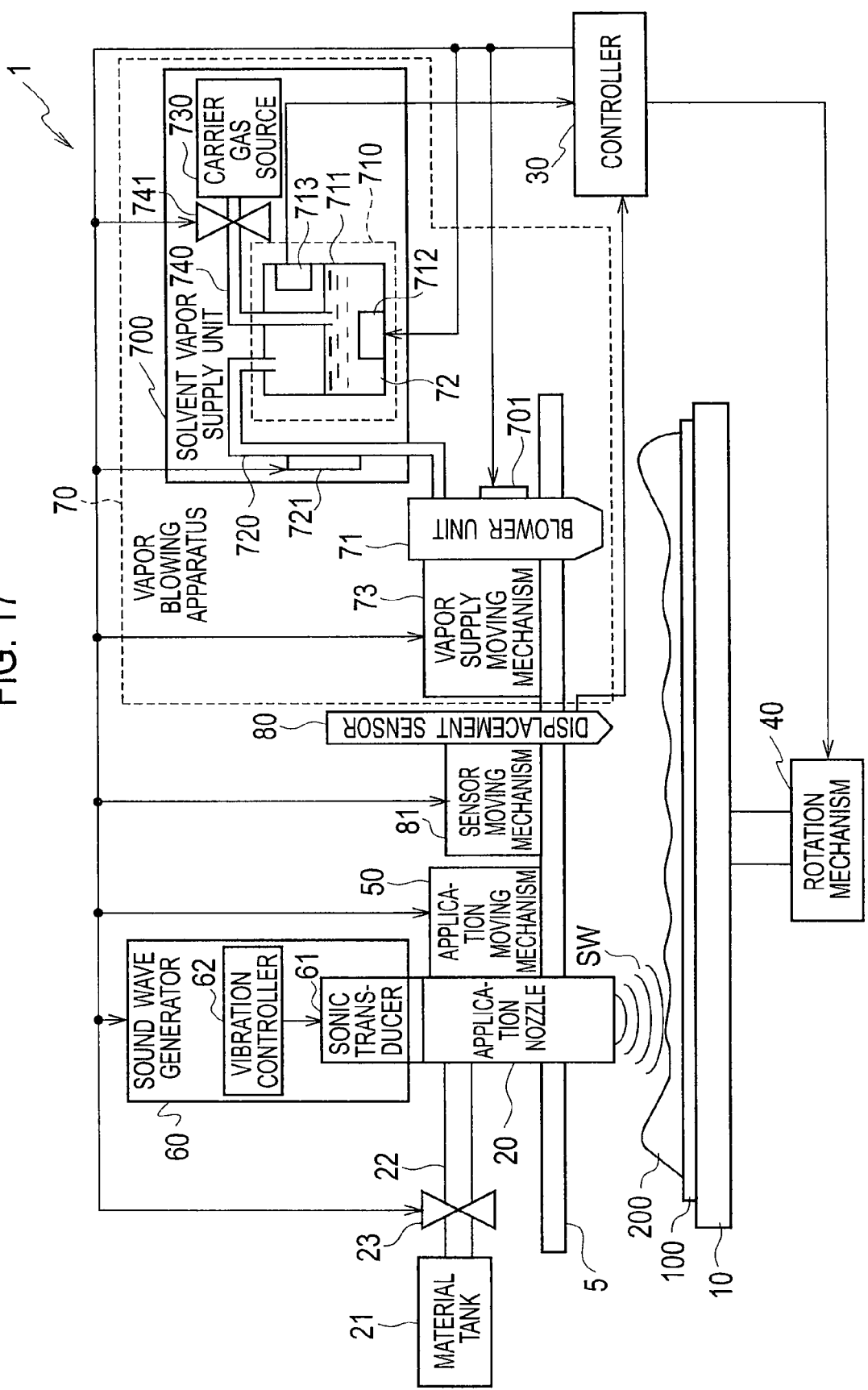
FIG. 17 is a schematic view showing a configuration of a film forming apparatus according to another modification of the third embodiment.

As shown in FIG. 17, the sonic transducer 61 of the sound wave generator 60 may be attached to the application nozzle 20 to project the sound wave SW through the application nozzle 20 onto the surface of the coating film 200.

Figure 18:
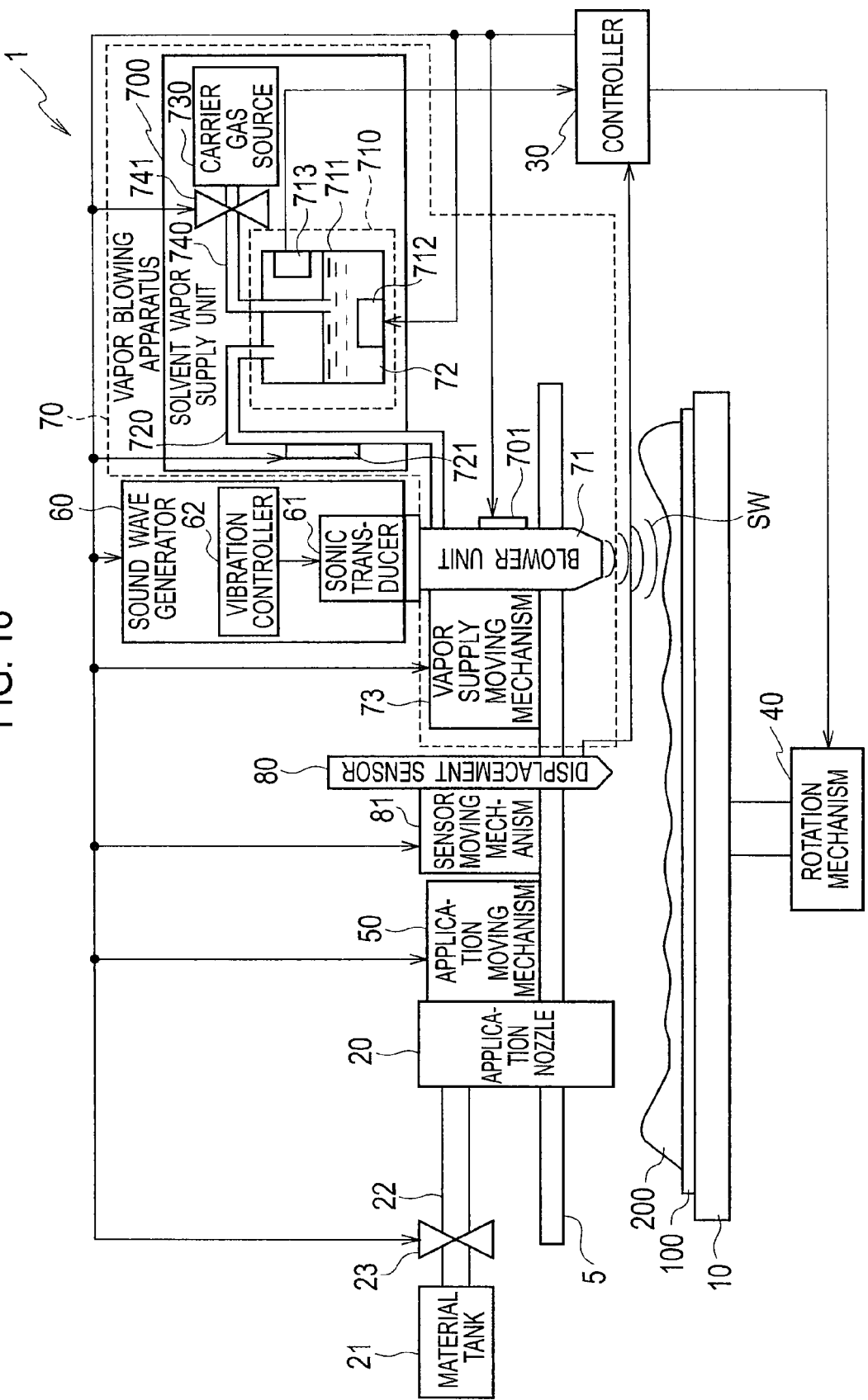
FIG. 18 is a schematic view showing a configuration of a film forming apparatus according to still another modification of the third embodiment.

Alternatively, as shown in FIG. 18, the sonic transducer 61 of the sound wave generator 60 may be attached to the blower unit 71. In a film forming apparatus 1 shown in FIG. 18, the sound wave generator 60 vibrates the blower unit 71, and the sound wave SW is projected from the blower unit 71 onto the surface of the coating film 200.

As already described, in the film forming methods using the film forming apparatuses 1 shown in FIGS. 15 to 18, the process of projecting the sound wave SW onto the surface of the coating film 200 and the process of blowing the solvent vapor can be executed in any order. Specifically, the solvent vapor may be blown onto the entire surface of the coating film 200 either before the sound wave SW is projected onto the entire surface of the coating film 200 or after the sound wave SW is projected onto the entire surface of the coating film 200. The solvent vapor may be blown onto the surface of the coating film 200 at the same time when the sound wave SW is projected.

While certain embodiments have been described, these embodiments have been presented by way of example only, and are not intended to limit the scope of the inventions. Indeed, the novel apparatus described herein may be embodied in a variety of other forms; furthermore, various omissions, substitutions and changes in the form of the apparatus described herein may be made without departing from the spirit of the inventions. The accompanying claims and their equivalents are intended to cover such forms or modifications as would fall within the scope and spirit of the inventions.

What is claimed is:

1. A film forming apparatus comprising:
a stage on which a coating object is placed;
a rotation mechanism configured to rotate the stage about a rotation axis extending in a normal direction of a surface of the coating object;
an application nozzle configured to supply coating material to the surface of the coating object;
an application moving mechanism configured to move a position of the application nozzle above the stage along the surface of the coating object;
a controller configured to control the rotation mechanism and application moving mechanism to rotate the stage and move the position of the application nozzle between a rotation center of the stage and an outer edge thereof and control the application nozzle to apply the coating material to the surface of the coating object and control a vibration controller;
a sound wave generator configured to generate a sound wave to be projected onto a surface of the coating film formed on the coating object, the sound wave generator comprising:
a sonic transducer configured to convert an electric energy to a sonic mechanical vibration to generate the sound wave;
said vibration controller configured to supply a driving voltage to the sonic transducer to operate the sonic transducer; and
a displacement sensor configured to detect a displacement of a profile of the coating film and transmit said displacement of the profile of said coating film to said controller
wherein the controller is configured to control the vibration controller to adjust the sound wave to be projected onto the surface of the coating film according to the detected displacement of the profile of the coating film.

2. The film forming apparatus of the claim 1, wherein
the sonic transducer is attached to the application nozzle, and
the sonic transducer vibrates the application nozzle to project the sound wave onto the surface of the coating film through the application nozzle.

3. The film forming apparatus of the claim 1, further comprises
a sonic horn configured to project the sound wave generated by the sound wave generator onto the surface of the coating film.

4. The film forming apparatus of the claim 1, further comprising:
a vapor blowing apparatus configured to blow vapor of solvent dissolving the coating material onto the surface of the coating object or coating film.

5. The film forming apparatus of the claim 4, wherein
the sound wave generator vibrates a blower unit of the vapor blowing apparatus to blow the vapor of the solvent dissolving the coating material onto the surface of the coating film through the blower unit.

6. The film forming apparatus of the claim 1, wherein
the controller controls the vibration controller to adjust projection conditions, which include at least any of an amplitude and frequency of the sound wave to be projected onto each region of the coating film and a time for projecting the sound wave onto the each region according to a thickness of the each region.

7. The film forming apparatus of the claim 3, wherein
the controller controls the vibration controller to adjust a distance between the sonic horn, which project the sound wave onto each region of the coating film, and the coating film according to a thickness of the each region.

8. The film forming apparatus of the claim 4, wherein
the vapor blowing apparatus comprises:
a blower unit blowing the vapor of the solvent onto the surface of the coating film; and
a solvent vapor supply unit supplying the vapor of the solvent onto the blower unit.

9. The film forming apparatus of the claim 8, wherein
the solvent vapor supply unit comprises:
a solvent vapor generator generating the vapor of the solvent; and
a vapor line feeding the vapor of the solvent from the solvent vapor generator to the blower unit,
wherein a temperature of the vapor line and a temperature of the blower unit are controlled higher than a dew point of the solvent.

10. The film forming apparatus of the claim 9, wherein
the vapor line includes a vapor line heater heating the vapor line,
the blower unit includes a blower unit heater heating the blower unit, and
the vapor line heater and the blower unit heater are electrically connected to the controller, which controls the temperature of the vapor line and the temperature of the blower unit higher than the dew point of the solvent.

11. The film forming apparatus of the claim 8, wherein
the controller controls the vapor blowing apparatus to adjust blowing conditions, which include at least any of a supply amount, temperature and flow rate of the vapor of the solvent to be blown onto each region of the coating film and a distance between the blower unit and the coating film according to a thickness of the each region detected by the displacement sensor.

* * * * *